(12) United States Patent
Pax

(10) Patent No.: US 8,356,146 B2
(45) Date of Patent: Jan. 15, 2013

(54) MEMORY REGISTER ENCODING APPARATUS AND METHODS

(75) Inventor: George Pax, Boise, ID (US)

(73) Assignee: Round Rock Research, LLC, Mt Kisco, NY (US)

( * ) Notice: Subject to any disclaimer, the term of this patent is extended or adjusted under 35 U.S.C. 154(b) by 0 days.

(21) Appl. No.: 13/439,619

(22) Filed: Apr. 4, 2012

(65) Prior Publication Data

US 2012/0195131 A1 Aug. 2, 2012

Related U.S. Application Data

(63) Continuation of application No. 13/074,917, filed on Mar. 29, 2011, now Pat. No. 8,156,291, which is a continuation of application No. 11/947,596, filed on Nov. 29, 2007, now Pat. No. 7,925,844.

(51) Int. Cl.
*G06F 12/00* (2006.01)

(52) U.S. Cl. ... 711/154; 711/105; 711/170; 365/189.03; 365/189.08; 365/230.06

(58) Field of Classification Search .................. 711/154, 711/105, 170; 365/189.03, 189.08, 230.06
See application file for complete search history.

(56) References Cited

U.S. PATENT DOCUMENTS

| | | | |
|---|---|---|---|
| 4,069,475 A * | 1/1978 | Boettcher | 365/205 |
| 5,375,086 A * | 12/1994 | Wahlstrom | 365/149 |
| 5,867,444 A | 2/1999 | Le et al. | |
| 6,229,727 B1 | 5/2001 | Doyle | |
| 6,272,609 B1 | 8/2001 | Jeddeloh | |
| 6,490,188 B2 | 12/2002 | Nuxoll et al. | |
| 6,667,895 B2 | 12/2003 | Jang et al. | |
| 6,898,648 B2 | 5/2005 | LaBerge | |
| 6,944,694 B2 | 9/2005 | Pax | |
| 7,139,852 B2 | 11/2006 | LaBerge | |
| 7,181,584 B2 | 2/2007 | LaBerge | |
| 7,783,846 B2 | 8/2010 | Chainer | |
| 7,925,844 B2 | 4/2011 | Pax | |
| 8,156,291 B2 | 4/2012 | Pax | |
| 2003/0014578 A1 | 1/2003 | Pax | |
| 2005/0177690 A1 | 8/2005 | LaBerge | |
| 2005/0216630 A1 | 9/2005 | Gaskins et al. | |
| 2007/0143553 A1 | 6/2007 | LaBerge | |
| 2008/0080284 A1 | 4/2008 | Mayer et al. | |
| 2008/0162778 A1 | 7/2008 | Choi et al. | |
| 2009/0044032 A1 | 2/2009 | Chainer | |
| 2009/0141564 A1 | 6/2009 | Pax | |
| 2011/0179221 A1 | 7/2011 | Pax | |

\* cited by examiner

*Primary Examiner* — Stephen Elmore
(74) *Attorney, Agent, or Firm* — Lerner, David, Littenberg, Krumholz & Mentlik, LLP

(57) ABSTRACT

Apparatus, systems, and methods are disclosed that operate to encode register bits to generate encoded bits such that, for pairs of addresses, an encoded bit to be coupled to a first address in a memory device may be exchanged with an encoded bit to be coupled to a second address in the memory device. Apparatus, systems, and methods are disclosed that operate to invert encoded bits in logic circuits in the memory device if original bits were inverted. Additional apparatus, systems, and methods are disclosed.

27 Claims, 8 Drawing Sheets

US 8,356,146 B2

MEMORY REGISTER ENCODING APPARATUS AND METHODS

PRIORITY APPLICATION

This application is a continuation of U.S. application Ser. No. 13/074,917, filed Mar. 29, 2011, now issued as U.S. Pat. No 8,156,291, which is a continuation of U.S. application Ser. No. 11/947,596, filed Nov. 29, 2007, now issued as U.S. Pat. No. 7,925,844, both of which are incorporated herein by reference in their entirety.

BACKGROUND

Mirroring is a memory device mounting technique that has made it easier to route conductors to memory device terminals. Memory devices are mounted in a mirrored configuration when the terminals of each memory device mounted on one surface of a substrate are positioned directly opposite corresponding terminals of a memory device mounted on the opposite surface of the substrate. Mirroring has the advantage of allowing conductors to extend to a single location on the substrate, connecting to a respective terminal on each surface of the substrate at that location. Significantly, there is no need to route a conductor coupled to a terminal of a memory device on one surface of the substrate to a different location for coupling to a corresponding terminal of a memory device on the opposite surface of the substrate. Memory device mirroring has the advantage of allowing more compact routing of conductors to the memory devices.

DETAILED DESCRIPTION

The inventor has discovered that it is advantageous to program or write to mode registers in memory devices of the same rank in a mirrored configuration at the same time. The inventor has also discovered that it is advantageous to program or write to mode registers in memory devices without the necessity of a controller knowing whether the memory devices are mounted in a mirrored configuration. In addition, the inventor has discovered that it is advantageous to restore bits that have been received by a memory device in inverted form (e.g., when inverted prior to transmission in order to reduce bit transitions across a parallel bus) to their original state.

According to embodiments of the invention shown and described below, pairs of addresses in a memory device are dedicated to writing to or programming mode registers in the memory device to accommodate the possibility of a memory device mounted in a mirrored configuration. Bits for the mode registers are encoded, and the encoded bits for each pair of addresses may be exchanged for one another. In other words, the encoded bits for each pair of addresses are interchangeable. The encoded bit coupled to one address in one memory device may also be coupled to a paired address in another memory device.

Embodiments of the invention shown and described below also include logic circuits to restore bits that have been inverted. These embodiments allow mode registers in memory devices of the same rank to be written to or programmed at substantially the same time, whether or not they are mounted in a mirrored configuration. An associated controller does not need to know if the memory devices are mounted in a mirrored configuration.

Figure 1:
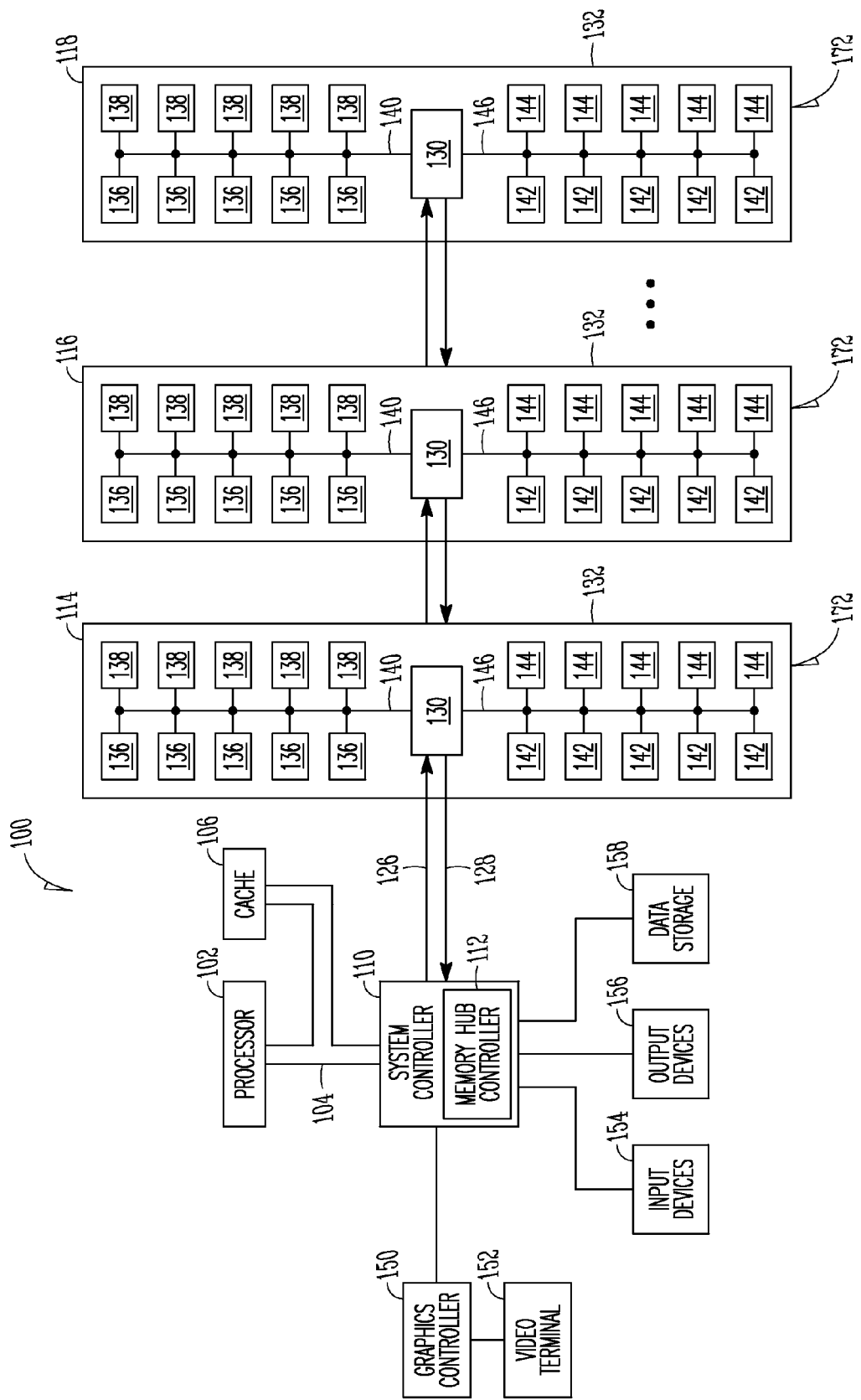
FIG. 1 is a block diagram of a system according to an embodiment of the invention.

FIG. 1 is a block diagram of a system 100 according to an embodiment of the invention. The system 100 includes a processor 102 for performing various computing functions, such as executing software to perform calculations or tasks. The processor 102 is coupled to a processor bus 104 that includes an address bus, a control bus, and a data bus. The processor bus 104 is coupled to a cache memory 106, which may comprise a static random access memory (SRAM) device according to an embodiment of the invention. The processor bus 104 is also coupled to a system controller 110, which is also sometimes referred to as a bus bridge.

The system controller 110 contains a memory hub controller 112 that is coupled to the processor 102. The memory hub controller 112 is also coupled to several memory modules 114, 116, and 118. The memory modules 114, 116, and 118 are dual in-line memory modules (DIMMs) according to some embodiments of the invention. The memory modules 114, 116, and 118 are coupled to each other through a downstream bus 126 and an upstream bus 128 which direct data, address, and/or control signals away from or toward, respectively, the memory hub controller 112.

Each of the memory modules 114, 116, and 118 may include a memory hub 130 mounted on a substrate 132. The memory hub 130 is coupled to several memory devices 136 and 138 on one side of the memory module 114, 116, or 118 through a first set of command and address buses 140, and to several memory devices 142 and 144 on the other side of the memory module 114, 116, or 118 through a second set of command and address buses 146. The memory hub 130 routes memory requests and responses between the memory hub controller 112 and the memory devices 136, 138, 142, and 144.

The memory hub 130 is not present in some embodiments, and in these embodiments of the invention the memory devices 136, 138, 142 and 144 may be coupled directly through the command and address buses 140 and 146, the downstream bus 126, and the upstream bus 128 to the memory hub controller 112. According to some embodiments of the invention, the system 100 includes separate memory hubs to couple separate data buses to the memory devices 136, 138, 142, and 144. The memory devices 136, 138, 142, and 144 may be identical to each other. According to some embodiments, the memory devices 136, 138, 142, and 144 comprise dynamic random access memory (DRAM) devices or synchronous dynamic random access memory (SDRAM) devices.

According to some embodiments of the invention, the memory modules 114, 116, and 118 are arranged in one of three types of DIMM modules, an unbuffered DIMM (UDIMM) where the address, control and data bits are not buffered; a registered DIMM (RDIMM) where there is a buffer for the address and control bits but not the data bits; and a fully buffered DIMM (FBDIMM) where there is buffering for the address, control, and data bits.

The system 100 includes more memory modules in addition to the memory modules 114, 116, and 118 according to some embodiments of the invention.

The system controller 110 also serves as a communications path to the processor 102 for other components according to some embodiments of the invention. For example, the system controller 110 includes a graphics port that is coupled to a graphics controller 150, which is, in turn, coupled to a video terminal 152. The system controller 110 is also coupled to one or more input devices 154, such as a keyboard or a mouse, to allow an operator to enter information into the system 100. The input device 154 may also be a wireless transceiver, a cellular telephone receiver configured to receive bits, the cellular telephone receiver forming a portion of the wireless transceiver, or a camera. The system 100 also includes one or more output devices 156 such as a printer, a display configured to display bits, an audio, video, or multi-media player, an audio device, or a modem coupled to the processor 102 through the system controller 110. One or more data storage devices 158 are also coupled to the processor 102 through the system controller 110 to allow the processor 102 to store data or retrieve data from internal or external storage media (not shown). Examples of the storage devices 158 include hard disk drives, floppy disk drives, banks of flash memory devices, tape cassettes, and compact disk read-only memories (CD-ROMs).

The memory devices 136 are mounted in a mirrored configuration with respect to the memory devices 138, and the memory devices 142 are mounted in a mirrored configuration with respect to the memory devices 144 according to an embodiment of the invention. The memory devices 136 and 142 are mounted on a first surface 170 of the substrate 132, and the memory devices 138 and 144 are mounted on a second surface 172 of the substrate 132. The memory devices 136 and 142 are preferably mounted directly opposite the memory devices 138 and 144, respectively, and their adjacent terminals are coupled to each other and to signal lines of the buses 140, 146, respectively. As a result, a terminal located at the upper left-hand corner of one of the memory devices 136 is coupled to a correspondingly positioned terminal located at the upper right-hand corner of the opposing memory device 138, for example. The terminals of the memory devices 136, 138, 142, and 144 are arranged so that address and data terminals of the memory devices 136, 142 are coupled to address and data terminals of the memory devices 138, 144, respectively, on opposite surfaces of the substrate 132 as will be further described hereinbelow.

Figure 2:
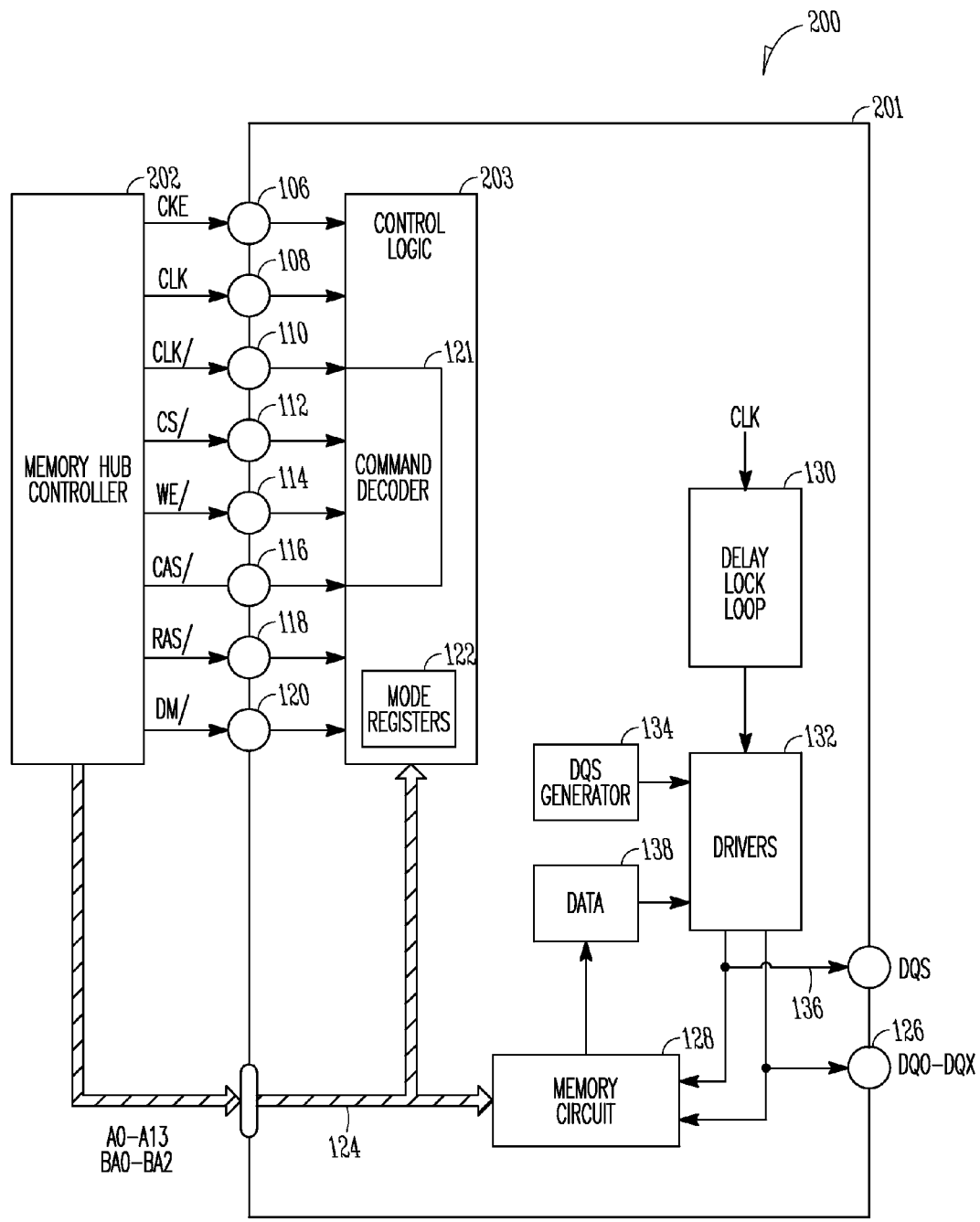
FIG. 2 is a block diagram of a system according to an embodiment of the invention.

FIG. 2 is a block diagram of a system 200 including a memory device 201 and a memory hub controller 202 according to an embodiment of the invention. The memory device 201 is an embodiment of one of the memory devices 136, 138, 142, and 144 shown in FIG. 1, and the memory hub controller 202 is an embodiment of the memory hub controller 112 shown in FIG. 1. The memory device 201 includes a control logic circuit 203 coupled to receive external command signals from the memory hub controller 202.

The external command signals include a clock enable signal CKE at a pin 206, a clock signal CLK at a pin 208, and a clock signal CLK/ at a pin 210. The "/" designation indicates that the signal is active low. A pin is a conductive physical device such as a wire or a metallic terminal comprising a port through which an external signal is coupled to an electronic device such as the memory device 201. The active low clock signal CLK/ is an inverted version of the clock signal CLK. The clock enable signal CKE is a signal indicating validity of the following clock signal.

The external command signals also include a chip select signal CS/ at pin 212, a write enable signal WE/ at a pin 214, a column address strobe signal CAS/ at a pin 216, a row address strobe signal RAS/ at a pin 218, and a data-mask signal DM/ at a pin 220. The external command signals at pins 206-220 are decoded in a command decoder 221.

The memory device 201 has one or more mode registers 222 that are programmed with information for operating the memory device 201. The memory device 201 also includes an address bus 224 that receives address bits at pins A0-A13 and BA0-BA2, a data bus 226 that receives and transmits data bits at pins DQ0-DQX, and a memory circuit 228 that contains data bits stored in the memory device 201. The address bus 224 and the data bus 226 each include approximately parallel conductive traces or lines that may be called channels, and these channels are coupled at each end to respective pins in respective devices such as the memory device 201 and the memory hub controller 202.

The address bits and data bits may comprise logical levels, perhaps indicating the processing of binary bits including ones and zeros. A one can be transmitted by a high voltage signal over a finite period of time, and a zero can be transmitted by a low voltage signal over a finite period of time. In some embodiments, the voltage levels representing ones and zeros are reversed.

The chip select signal CS/ at the pin 212 is a signal used to select one device, such as the memory device 201, out of several devices connected to the same bus. A low CS/ signal enables the command decoder 221 in the memory device 201, and a high CS/ disables the command decoder 221. All commands are masked from the memory device 201 when the CS/ signal is high, but READ/WRITE bursts already in progress will continue to completion, and a data mask (DQM) operation will retain its DQ mask capability while CS/ is high. Thus, the low CS/ signal enables a device connected to a bus to respond to commands and data on the bus while the high CS/ signal tells the device to ignore the bus. The CS/Attorney signal provides for external bank selection on systems with multiple banks. Multiple memory devices receiving the same CS/ signal are of the same rank in a system.

Address inputs at the pins A0-A13 and BA0-BA2 are captured on a falling edge of the row address strobe signal RAS/ at pin 218, and a row corresponding to the address is opened. The row is held open as long as the row address strobe signal RAS/ is low. Address inputs are captured on a falling edge of the column address strobe signal CAS/ at pin 216, and a column corresponding to the captured address is selected from the currently open row for a read or write operation.

The write enable signal WE/ at pin 214 determines whether a given falling edge of the column address strobe signal CAS/ initiates a read or a write operation. A high write enable signal WE/ directs a read operation, while a low write enable signal WE/ directs a write operation. If the write enable signal WE/ is low, data is captured at input pins on the falling edge of the column address strobe signal CAS/. The signals WE/, CAS/, RAS/, and CS/ can, in various combinations, represent other commands not described above.

The data-mask signal DM/ at pin 220 controls input and output over the data bus 226 during read and write operations. The data bus 226 is activated to carry data to or from the memory device 201 if the data-mask signal DM/ is low, and data on the data bus 226 is masked from the memory device 201 if the data-mask signal DM/ is high.

The memory circuit 228 is coupled to the address bus 224 to receive information identifying a location in the memory circuit 228 which is to be written or read. Management of read and write operations is performed by the control logic circuit 203 upon receiving the external command signals from the memory hub controller 202. The read and write operations of the memory device 201 are also controlled using a delay lock loop 230 having a CLK signal input to adjust timing provided to multiple drivers 232. Read and write operations are further controlled with a data strobe signal (DQS) that is generated by a DQS generator 234 coupled to the drivers 232. The DQS signal is placed on a DQS line 236. In addition, the drivers 232 put data received from the memory circuit 228 through a data buffer 238 onto the data bus 226. The mode registers 222 have operating information that is programmed by the memory hub controller 202 on initialization or boot-up of the system 200 that will be further described hereinbelow.

The memory device 201, as well as the mode registers 222 and the controller 201, can each be realized as a single integrated circuit. The memory device 201 can be formed on a semiconductor die using a substrate, where the substrate is a material such as silicon, germanium, silicon on sapphire, gallium arsenide, or other semiconductor material. The elements of the memory device 201 are fabricated using conventional processing, well-known to those of ordinary skill in the art, to form the various circuits within the semiconductor material and for providing electrical connections for coupling to an address bus, a data bus, and control lines for communication with a controller or a processor.

Figure 3:
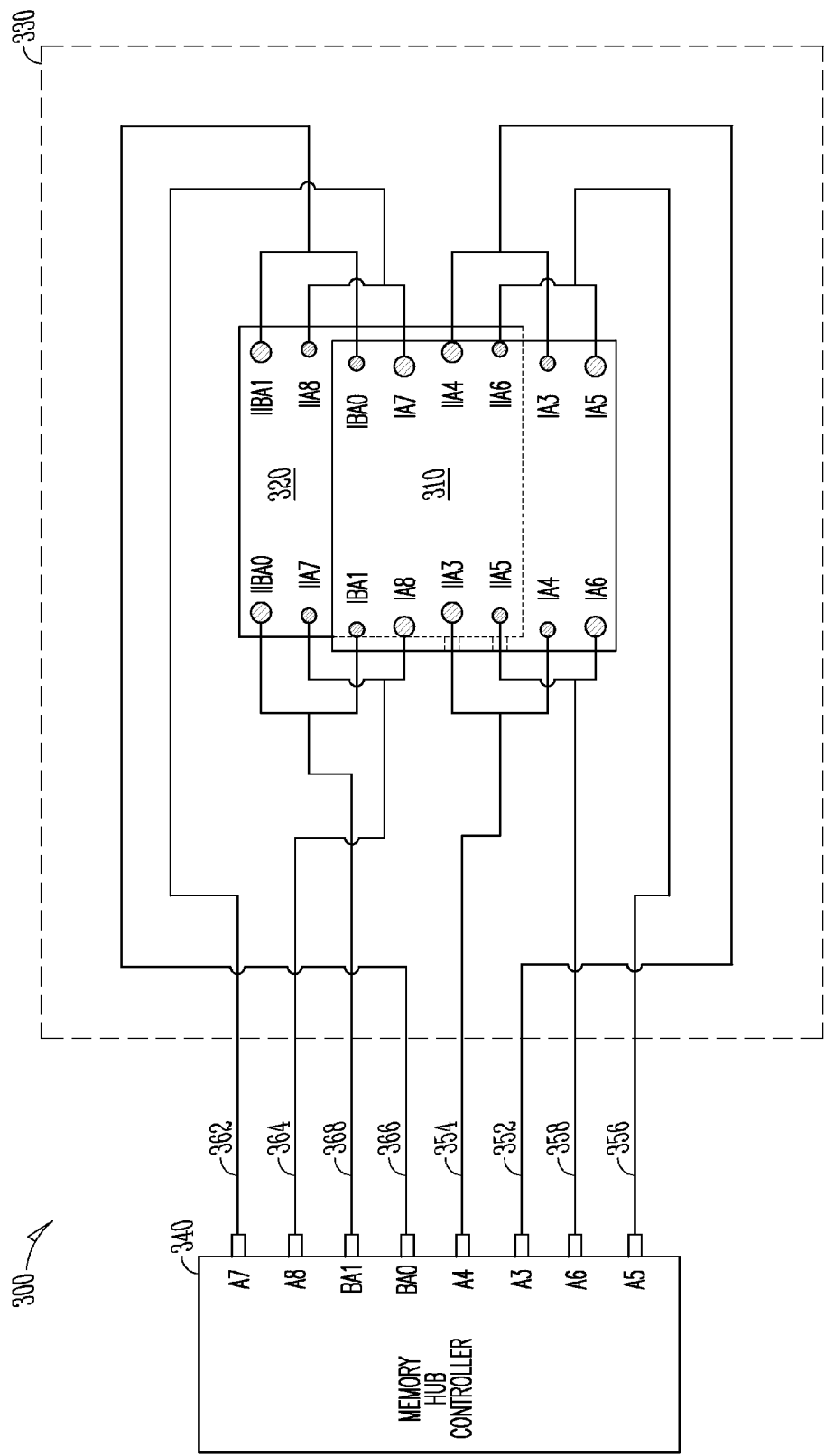
FIG. 3 is a block diagram of a system according to an embodiment of the invention.

FIG. 3 is a block diagram of a system 300 according to an embodiment of the invention. The system 300 includes a first memory device 310 and a second memory device 320 mounted on opposite sides of a substrate 330 in a mirrored arrangement. In some embodiments, the substrate 330 comprises a printed circuit board. Bonding pads are shown as circles with cross-hatching on each of the first and second memory devices 310 and 320, and each bonding pad is coupled to one address line from a memory hub controller 340. Bonding pads in the first memory device 310 are identified by the Roman numeral I as a prefix to an address location in a mode register (not shown) in the first memory device 310 that is to receive information from a signal at the bonding pad. Similarly, bonding pads in the second memory device 320 are identified by the Roman numeral II as a prefix to an address location in a mode register (not shown) in the second memory device 320 that is to receive information from a signal at the bonding pad. Specifically, the first memory device 310 includes bonding pads IA3, IA4, IA5, IA6, IA7, IA8, IBA0, and IBM. The second memory device 320 includes bonding pads IIA3, IIA4, IIA5, IIA6, IIA7, IIA8, IIBA0, and IIBA1. The signals received at the bonding pads represent address information that may be encoded before being added to the respective mode register as will be further described hereinbelow. The first and second memory devices 310 and 320 are embodiments of one of the memory devices 136, 138, 142, and 144 shown in FIG. 1 or the memory device 201 shown in FIG. 2. The memory hub controller 340 is an embodiment of the memory hub controller 112 shown in FIG. 1 or the memory hub controller 202 shown in FIG. 2.

The mirrored arrangement of the first memory device 310 and the second memory device 320 on the substrate 330 provides a mechanism wherein the addresses of the bonding pads of the first memory device 310 are located opposite different addresses of the bonding pads of the second memory device 320 through the substrate 330. The opposing bonding pads face each other and are coupled together through the substrate 330 as mirrored pairs to receive the same address signal from the memory hub controller 340. The mirrored pairs of bonding pads are coupled together by lines shown in FIG. 3 which are conductive lines or traces, and each line is capable of carrying a signal to the associated bonding pads. The mirrored pairs of bonding pads correspond to mirrored pairs of addresses: A3 with A4, A5 with A6, A7 with A8, and BA0 with BA1. The specific bonding pads are coupled as pairs: IA3 to IIA4, IA5 to IIA6, IA7 to IIA8, and IBA0 to IIBA1, and symmetrically in the opposite direction the bonding pads are also coupled as pairs: IIA3 to IA4, IIA5 to IA6, IIA7 to IA8, and IIBA0 to IBA1. The memory hub controller 340 generates an address bit for each of the addresses A3, A4, A5, A6, A7, A8, BA0, and BA1, and couples a single address bit to each of the mirrored pairs of bonding pads. Specifically, the memory hub controller 340 couples an A3 bit to IA3 and IIA4 on a line 352, an A4 bit to IIA3 and IA4 on a line 354, an A5 bit to IA5 and IIA6 on a line 356, an A6 bit to IIA5 and IA6 on a line 358, an A7 bit to IA7 and IIA8 on a line 362, an A8 bit to IIA7 and IA8 on a line 364, a BA0 bit to IIBA1 and IBA0 on a line 366, and a BA1 bit to IBA1 and IIBA0 on a line 368.

Figure 4:
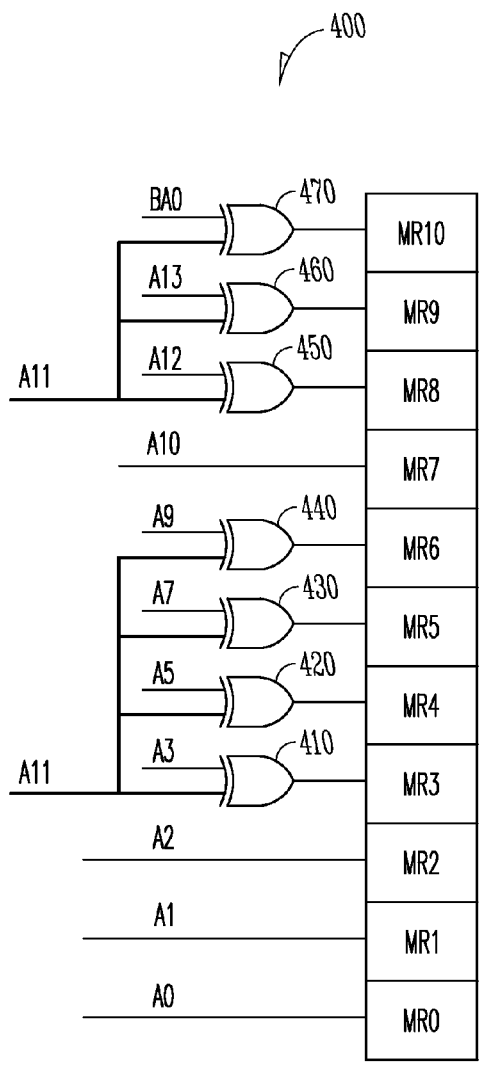
FIG. 4 is a block diagram of a mode register with logic circuits according to an embodiment of the invention.
Figure 5:
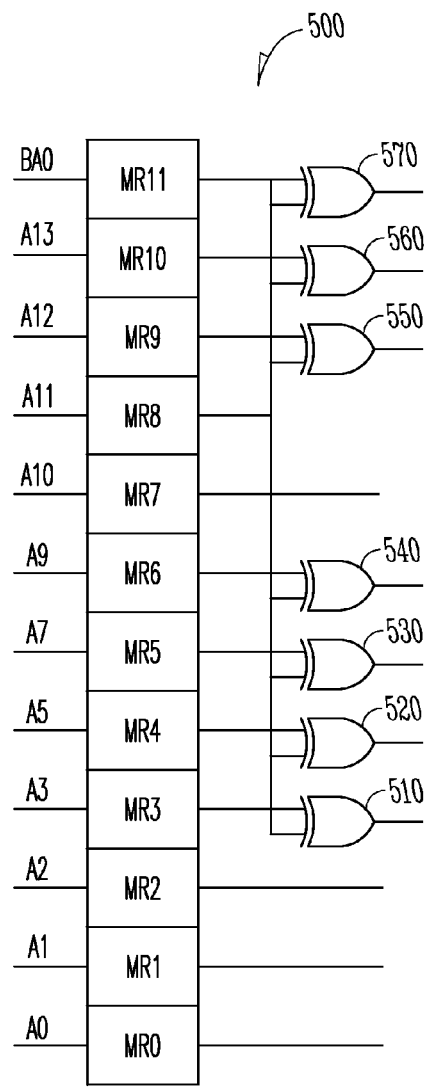
FIG. 5 is a block diagram of a mode register with logic circuits according to an embodiment of the invention.

According to embodiments of the invention shown in FIG. 4 and FIG. 5, pairs of addresses in a memory device can be dedicated to writing to or programming mode registers in a memory device to accommodate the possibility that the memory device is mounted in a mirrored configuration. The pairs of addresses shown are: A3 with A4, A5 with A6, A7 with A8, and BA0 with BA1. The same encoded bits, either zeros or ones, are written to both addresses in each pair of addresses. The bit from only one of the addresses in each pair is written to or programmed in a location in the mode register. The encoded bits for each pair of addresses may therefore be exchanged with one another. In other words, the encoded bits for each pair of addresses are interchangeable. The encoded bit coupled to one address in one memory device may also be coupled to a paired address in another memory device.

The embodiments of the invention shown in FIG. 4 and FIG. 5 also include logic circuits to restore bits that have been inverted. These embodiments of the invention allow mode registers in memory devices of the same rank to be written to or programmed at the same time whether or not they are mounted in a mirrored configuration. A memory hub controller does not need to know if the memory devices are mounted in a mirrored configuration.

FIG. 4 is a block diagram of a mode register 400 with logic circuits in a memory device such as the memory device 201 shown in FIG. 2 or the memory devices shown in FIG. 1 and FIG. 3 according to an embodiment of the invention. The mode register 400 includes eleven locations MR0, MR1, MR2, MR3, MR4, MR5, MR6, MR7, MR8, MR9, and MR10 to store bits for operating a memory device. The locations MR0, MR1, MR2, and MR7 are coupled directly to address lines A0, A1, A2, and A10, respectively, to receive the bits transmitted on those lines.

The locations MR3, MR4, MR5, MR6, MR8, MR9, and MR10 are coupled to outputs of exclusive-OR (EXOR) logic gates to receive bits in the following manner. The location MR3 is coupled to an output of an EXOR logic gate 410, and two inputs of the EXOR logic gate 410 are coupled to the address lines A3 and A11 such that the location MR3 receives the bit on the address line A3 modified by the bit on the address line A11 through the EXOR logic gate 410. The location MR4 is coupled to an output of an EXOR logic gate 420, and two inputs of the EXOR logic gate 420 are coupled to the address lines A5 and A11 such that the location MR4 receives the bit on the address line A5 modified by the bit on the address line A11 through the EXOR logic gate 420. The location MR5 is coupled to an output of an EXOR logic gate 430, and two inputs of the EXOR logic gate 430 are coupled to the address lines A7 and A11 such that the location MR4 receives the bit on the address line A7 modified by the bit on the address line A11 through the EXOR logic gate 430. The location MR6 is coupled to an output of an EXOR logic gate 440, and two inputs of the EXOR logic gate 440 are coupled to the address lines A9 and A11 such that the location MR6 receives the bit on the address line A9 modified by the bit on the address line A11 through the EXOR logic gate 440. The location MR8 is coupled to an output of an EXOR logic gate 450, and two inputs of the EXOR logic gate 450 are coupled to the address lines A12 and A11 such that the location MR8 receives the bit on the address line A12 modified by the bit on the address line A11 through the EXOR logic gate 450. The location MR9 is coupled to an output of an EXOR logic gate 460, and two inputs of the EXOR logic gate 460 are coupled to the address lines A13 and A11 such that the location MR9 receives the bit on the address line A13 modified by the bit on the address line A11 through the EXOR logic gate 460. Finally, the location MR10 is coupled to an output of an EXOR logic gate 470, and two inputs of the EXOR logic gate 470 are coupled to the address lines BA0 and A11 such that the location MR10 receives the bit on the address line BA0 modified by the bit on the address line A11 through the EXOR logic gate 470.

In the embodiment of the invention shown in FIG. 4, the address lines A4, A6, A8, and BA1 are not coupled to locations in the mode register 400 because they carry the same bits as the corresponding address lines A3, A5, A7, and BA0 in the respective pairs of addresses.

The bits on the address lines A3, A5, A7, A9, A12, A13, and BA0 may be inverted according to a data bus inversion (DBI) algorithm according to embodiments of the invention. DBI is a technique of encoding bits that first looks at a relationship between bits to be transmitted across a bus and decides, according to an algorithm, if it would be advantageous to invert the bits prior to transmission. An additional bit transmitted on a separate line, referred to as a DBI bit, is set when the bits on the address lines A3, A5, A7, A9, A12, A13, and BA0 are inverted. The DBI bit identifies to the mode register 400 which sets of transmitted bits have been inverted. The mode register 400 then uses the DBI bit to return the incoming bits to their original state for use by the memory device. The bits may or may not be inverted according to the DBI algorithm.

One DBI algorithm is referred to as a "minimum transitions" algorithm. In general, the minimum transitions algorithm begins by computing how many bits transmitted across a parallel bus will result in a transition during the upcoming cycle. When more than a predetermined number of transitions are predicted, the minimum transitions algorithm inverts the bits to be transmitted over the parallel bus, sets the DBI bit to a first specified state (high or low depending on the implementation), and drives the encoded bits and the DBI bit across transmission channels in the parallel bus. When more than a predetermined number of transitions are not predicted, the minimum transitions algorithm does not invert the bits to be transmitted over the parallel bus, sets the DBI bit to a second specified state (high or low depending on the implementation), and drives the encoded bits and the DBI bit across transmission channels in the parallel bus. The DBI bit is used to restore the original bits prior to use in a receiving system. Variations of the minimum transitions algorithm may be used in some embodiment.

A second DBI algorithm is referred to as a "minimum zeros" algorithm. The minimum zeros algorithm reduces the number of binary zeros in bits transmitted across a parallel bus. The minimum zeros algorithm inverts the bits if more than a predetermined number of the bits are binary zeros. The bits are not inverted if less than the predetermined number of the bits are binary zeros. The predetermined number can be, for example, half of the total number of bits. Thus, according to the algorithm, whether the bits are or are not inverted, the DBI bit is set to a corresponding state (high or low depending on the implementation), and the encoded bits and the DBI bit are driven across transmission channels in the parallel bus. The DBI bit is used to restore the original bits prior to use in a receiving system.

A variation of the minimum zeros algorithm is referred to as the "minimum ones" algorithm. The minimum ones algorithm reduces the number of binary ones in bits transmitted across a parallel bus. The minimum ones algorithm inverts the bits if more than a predetermined number of the bits are binary ones. The bits are not inverted if less than the predetermined number of the bits are binary ones. The predetermined number can be, for example, half of the total number of bits. Thus, according to the algorithm, whether the bits are or are not inverted, the DBI bit is set to a corresponding state (high or low depending on the implementation), and the encoded bits and the DBI bit are driven across transmission channels in the parallel bus. The DBI bit is used to restore the original bits prior to use in a receiving system.

The bits on the address lines A3, A5, A7, A9, A12, A13, and BA0 may or may not be inverted according to one of the DBI algorithms and are referred to as being encoded when transmitted according to the DBI algorithms. The DBI bit is transmitted on the address line A11. A high DBI bit on the address line A11 indicates that the encoded bits on the address lines A3, A5, A7, A9, A12, A13, and BA0 are inverted. A low DBI bit on the address line A11 indicates that the encoded bits on the address lines A3, A5, A7, A9, A12, A13, and BA0 are not inverted. Of course, other logic conventions may be used.

The bits on the address lines A3, A5, A7, A9, A12, A13, and BA0 may be inverted by a 1:2 buffer circuit according to embodiments of the invention. A 1:2 buffer circuit is a one-input, two-output buffer circuit that receives a single bit at an input and transmits two bits at two respective outputs that are inverted with respect to each other. The state of the bits on the address lines A3, A5, A7, A9, A12, A13, and BA0, inverted or not inverted, is determined by which outputs of the 1:2 buffer are coupled to locations in the mode register 400.

The EXOR logic gates 410, 420, 430, 440, 450, 460, and 470 restore original bits on the address lines A3, A5, A7, A9, A12, A13, and BA0 in the following manner. If the transmitted bits on the address lines A3, A5, A7, A9, A12, A13, and BA0 were inverted from original bits prior to being transmitted, the DBI bit is a binary one, and the bits on the address lines A3, A5, A7, A9, A12, A13, and BA0 are inverted by the respective EXOR logic gates 410, 420, 430, 440, 450, 460, and 470 to generate the original bits that are coupled to the respective locations MR3-MR6 and MR8-MR10 in the mode register 400. If the transmitted bits on the address lines A3, A5, A7, A9, A12, A13, and BA0 were not inverted from original bits prior to being transmitted, the DBI bit is a binary zero, and the bits on the address lines A3, A5, A7, A9, A12, A13, and BA0 are not changed by the respective EXOR logic gates 410, 420, 430, 440, 450, 460, and 470 but passed through to the respective locations MR3-MR6 and MR8-MR10 in the mode register 400. In either case, the mode register 400 stores the original bits to be used by the memory device. The voltage levels of the DBI bit may be reversed and convey the same information with appropriate logic in the mode register 400 to interpret the DBI bit according to embodiments of the invention.

FIG. 5 is a block diagram of a mode register 500 with logic circuits in a memory device such as the memory device 201 shown in FIG. 2 or the memory devices shown in FIG. 1 and FIG. 3 according to an embodiment of the invention. The mode register 500 includes twelve locations MR0, MR1, MR2, MR3, MR4, MR5, MR6, MR7, MR8, MR9, MR10, and MR11 that are coupled directly to lines to store bits, some of the bits having been encoded according to a DBI algorithm. The locations MR0, MR1, MR2, and MR3 are coupled directly to address lines A0, A1, A2, and A3, respectively, to receive the bits transmitted on those lines. The locations MR4, MR5, MR6, MR7, MR8, MR9, MR10, and MR11 are coupled directly to address lines A5, A7, A9, A10, A11, A12, A13, and BA0, respectively, to receive the bits transmitted on those lines. The bits on the address lines A3, A5, A7, A9, A12, A13, and BA0 may be encoded according to a DBI algorithm such as the minimum transitions algorithm, the minimum zeros algorithm, or the minimum ones algorithm, or may be encoded and then inverted by a 1:2 buffer circuit. A DBI bit is transmitted on the address line A11 to indicate the state of the bits on the address lines A3, A5, A7, A9, A12, A13, and BA0. The mode register 500 includes logic circuits on an output side to restore original bits from the encoded bits stored in the locations MR3, MR4, MR5, MR6, MR9, MR10, and MR11. The location MR3 is coupled to a first input of an EXOR logic gate 510. The location MR4 is coupled to a first input of an EXOR logic gate 520. The location MR5 is coupled to a first input of an EXOR logic gate 530. The location MR6 is coupled to a first input of an EXOR logic gate 540. The location MR9 is coupled to a first input of an EXOR logic gate 550. The location MR10 is coupled to a first input of an EXOR logic gate 560. The location MR11 is coupled to a first input of an EXOR logic gate 570. A second input of each of the EXOR logic gates 510, 520, 530, 540, 550, 560, and 570 is coupled to the location MR8 to receive the DBI bit stored therein.

The EXOR logic gates 510, 520, 530, 540, 550, 560, and 570 restore original bits from the encoded bits in the locations MR3, MR4, MR5, MR6, MR9, MR10, and MR11 in a manner similar to the EXOR logic gates in the mode register 400 described above. If the DBI bit is a binary one, the EXOR logic gates 510, 520, 530, 540, 550, 560, and 570 invert the bits in the locations MR3, MR4, MR5, MR6, MR9, MR10, and MR11 to generate original bits on respective outputs of the EXOR logic gates 510, 520, 530, 540, 550, 560, and 570 to be used by a memory device including the mode register 500. If the DBI bit is a binary zero, the bits in the locations MR3, MR4, MR5, MR6, MR9, MR10, and MR11 are passed through the EXOR logic gates 510, 520, 530, 540, 550, 560, and 570 unchanged to the respective outputs of the EXOR logic gates 510, 520, 530, 540, 550, 560, and 570 to be used by the memory device. Other logic conventions may be used.

The EXOR logic gates 410, 420, 430, 440, 450, 460, and 470 restore original bits in the mode register 400, and the EXOR logic gates 510, 520, 530, 540, 550, 560, and 570 restore original bits in the mode register 500 that may have been inverted according to a DBI algorithm. Different logic circuitry is used to restore original bits in mode registers according to other embodiments of the invention.

In the embodiment of the invention shown in FIG. 5, the address lines A4, A6, A8, and BA1 are not coupled to locations in the mode register 500 because they carry the same bits as the corresponding address lines A3, A5, A7, and BA0 in the respective pairs of addresses.

According to embodiments of the invention shown in FIG. 6 and described below, pairs of addresses in a memory device are dedicated to writing to or programming mode registers in the memory device to accommodate the possibility that memory devices are mounted in a mirrored configuration. The pairs of addresses are A3 with A4, A5 with A6, A7 with A8, and BA0 with BA1. For each pair of addresses, the two encoded bits are received in two respective inputs of an EXOR logic gate, and an output of the EXOR logic gate is coupled to a location in a mode register. The two encoded bits are encoded to be different to result in a one in the location in the mode register, and the two encoded bits are encoded to be the same to result in a zero in the location in the mode register. Both address lines for each pair of addresses are received in the mode register. The encoded bits for each pair of addresses may therefore be exchanged for one another. In other words, the encoded bits for each pair of addresses are interchangeable. The encoded bit coupled to one address in one memory device may also be coupled to the paired address in another memory device. The embodiments of the invention shown in FIG. 6 and described below also include logic circuits to restore bits that have been inverted. These embodiments of the invention allow mode registers in memory devices of the same rank to be written to or programmed at the same time whether or not they are mounted in a mirrored configuration. The memory hub controller does not need to know if the memory devices are mounted in a mirrored configuration.

Figure 6:
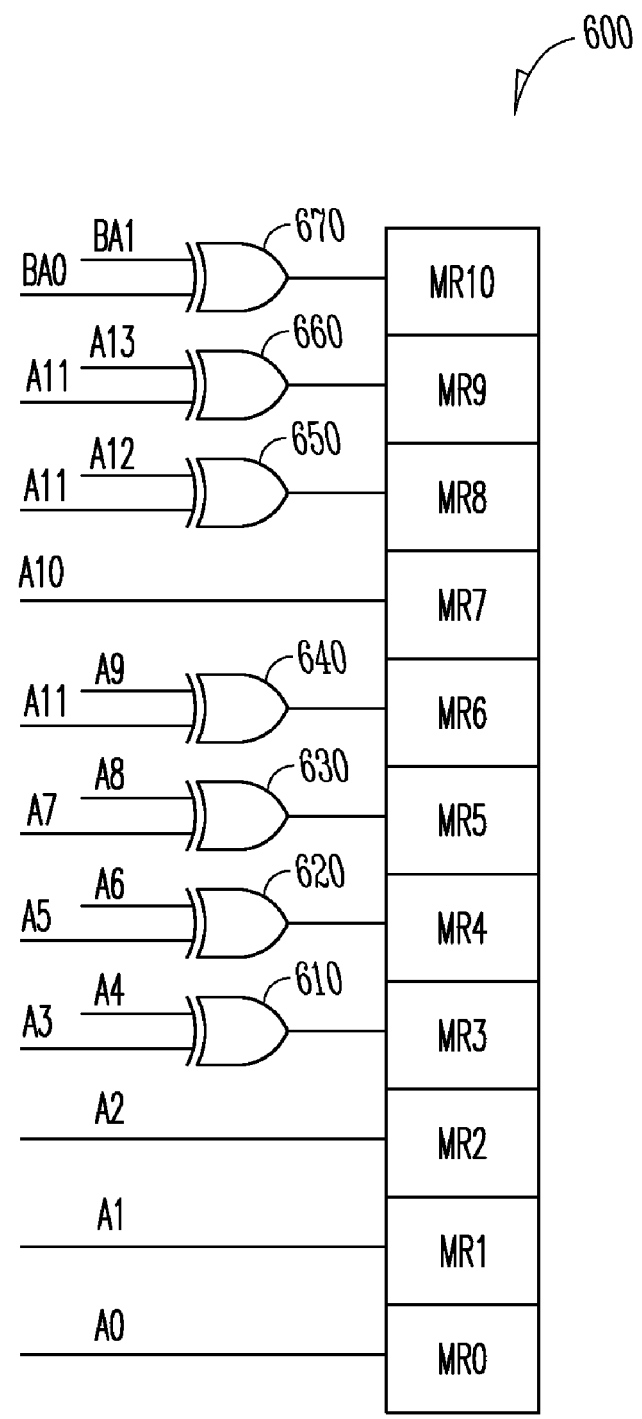
FIG. 6 is a block diagram of a mode register with logic circuits according to an embodiment of the invention.

FIG. 6 is a block diagram of a mode register 600 with logic circuits in a memory device similar to or identical to the memory device 201 shown in FIG. 2, or the memory devices shown in FIG. 1 and FIG. 3 according to an embodiment of the invention. The logic circuits encode bits from address lines to accommodate for the memory device being mounted in a mirrored configuration or not being mirrored in a mounted configuration. The mode register 600 includes eleven locations MR0, MR1, MR2, MR3, MR4, MR5, MR6, MR7, MR8, MR9, and MR10 to store bits for operating the memory device. The locations MR0, MR1, MR2, and MR7 are coupled directly to address lines A0, A1, A2, and A10, respectively, to receive the bits transmitted on those lines.

The locations MR3, MR4, MR5, MR6, MR8, MR9, and MR10 are coupled to outputs of EXOR logic gates 610, 620, 630, 640, 650, 660, and 670, respectively, and receive bits in the following manner. Two inputs of the EXOR logic gate 610 are coupled to the address lines A3 and A4 such that the location MR3 receives a binary one if the bits on the address lines A3 and A4 are different, and the location MR3 receives a binary zero if the bits on the address lines A3 and A4 are the same. Two inputs of the EXOR logic gate 620 are coupled to the address lines A5 and A6 such that the location MR4 receives a binary one if the bits on the address lines A5 and A6 are different, and the location MR4 receives a binary zero if the bits on the address lines A5 and A6 are the same. Two inputs of the EXOR logic gate 630 are coupled to the address lines A7 and A8 such that the location MR5 receives a binary one if the bits on the address lines A7 and A8 are different, and the location MR5 receives a binary zero if the bits on the address lines A7 and A8 are the same. Two inputs of the EXOR logic gate 670 are coupled to the address lines BA0 and BA1 such that the location MR10 receives a binary one if the bits on the address lines BA0 and BA1 are different, and the location MR10 receives a binary zero if the bits on the address lines BA0 and BA1 are the same. The bits on the pairs of address lines A3 and A4, A5 and A6, A7 and A8, and BA0 and BA1 may or may not be inverted according to a DBI algorithm or by a 1:2 buffer circuit, but such an inversion would not change the bits entered in the locations MR3, MR4, MR5, and MR10.

The bits on the address lines A9, A12, and A13 may or may not be inverted according to a DBI algorithm or by a 1:2 buffer circuit. Two inputs of the EXOR logic gate 640 are coupled to the address lines A9 and A11. A DBI bit is transmitted on the address line A11 such that the location MR6 receives the bit on the address line A9 if the DBI bit is a binary zero. The EXOR logic gate 640 inverts the bit on the address line A9 if the DBI bit is a binary one such that the location MR6 receives a bit inverted from the bit on the address line A9. Two inputs of the EXOR logic gate 650 are coupled to the address lines A12 and A11 such that the location MR8 receives the bit on the address line A12 if the DBI bit is a binary zero. The EXOR logic gate 650 inverts the bit on the address line A12 if the DBI bit is a binary one such that the location MR8 receives a bit inverted from the bit on the address line A12. Finally, two inputs of the EXOR logic gate 660 are coupled to the address lines A13 and A11 such that the location MR9 receives the bit on the address line A13 if the DBI bit is a binary zero. The EXOR logic gate 660 inverts the bit on the address line A13 if the DBI bit is a binary one such that the location MR9 receives a bit inverted from the bit on the address line A13. Other logic conventions may be used.

The EXOR logic gates 410, 420, 430, 440, 450, 460, and 470 shown in FIG. 4, the EXOR logic gates 510, 520, 530, 540, 550, 560, and 570 shown in FIG. 5, and the EXOR logic gates 610, 620, 630, 640, 650, 660, and 670 shown in FIG. 6 each operate according to the truth table shown in Table I according to some embodiments of the invention. A first input is represented in column A, a second input is represented in column B, and the output is represented in column EXOR.

TABLE I

| A | B | EXOR |
|---|---|------|
| 0 | 0 | 0 |
| 0 | 1 | 1 |
| 1 | 0 | 1 |
| 1 | 1 | 0 |

The locations MR0-MR10 in the mode register 600 hold bits that select operating parameters for the memory device. The three locations MR8, MR9, and MR10 hold bits identifying the mode register as one of eight different mode registers as is shown in the truth table shown in Table II according to some embodiments of the invention. Columns MR8, MR9, and MR10 show the bits stored in the respective locations MR8, MR9, and MR10. The column Mode Register indicates which mode register (0-7) is identified by the bits in the locations MR8, MR9, and MR10.

TABLE II

| MR10 | MR9 | MR8 | Mode Register |
|------|-----|-----|---------------|
| 0 | 0 | 0 | Mode Register 0 |
| 0 | 0 | 1 | Mode Register 1 |
| 0 | 1 | 0 | Mode Register 2 |
| 0 | 1 | 1 | Mode Register 3 |
| 1 | 0 | 0 | Mode Register 4 |
| 1 | 0 | 1 | Mode Register 5 |
| 1 | 1 | 0 | Mode Register 6 |
| 1 | 1 | 1 | Mode Register 7 |

The three locations MR5, MR6, and MR7 hold bits setting a write recovery time for the memory device. The write recovery time is the time in clock cycles that elapses between a memory hub controller instructing data to be written to memory cells in the memory device and the data being stored in the memory cells. The three locations MR5, MR6, and MR7 hold bits setting the write recovery time as is shown in the truth table shown in Table III according to some embodiments of the invention. Columns MR5, MR6, and MR7 show the bits stored in the respective locations MR5, MR6, and MR7. The column Write Recovery indicates the write recovery time in clock cycles determined by the bits in the locations MR5, MR6, and MR7.

TABLE III

| MR7 | MR6 | MR5 | Write Recovery |
|-----|-----|-----|----------------|
| 0 | 0 | 0 | 7 |
| 0 | 0 | 1 | 8 |
| 0 | 1 | 0 | 9 |
| 0 | 1 | 1 | 10 |
| 1 | 0 | 0 | 11 |
| 1 | 0 | 1 | 12 |
| 1 | 1 | 0 | 13 |
| 1 | 1 | 1 | 14 |

The three locations MR2, MR3, and MR4 hold bits setting a column address strobe (CAS) latency for the memory device. The CAS latency is the time in clock cycles that elapses between a memory hub controller instructing the memory device to access particular memory cells and the data being read from output pins of the memory device. The three locations MR2, MR3, and MR4 hold bits setting the CAS latency as is shown in the truth table shown in Table IV according to some embodiments of the invention. Columns MR2, MR3, and MR4 show the bits stored in the respective locations MR2, MR3, and MR4. The column CAS Latency indicates the CAS latency in clock cycles determined by the bits in the locations MR2, MR3, and MR4.

TABLE IV

| MR4 | MR3 | MR2 | CAS Latency |
|-----|-----|-----|-------------|
| 0 | 0 | 0 | 7 |
| 0 | 0 | 1 | 8 |
| 0 | 1 | 0 | 9 |
| 0 | 1 | 1 | 10 |
| 1 | 0 | 0 | 11 |
| 1 | 0 | 1 | 12 |
| 1 | 1 | 0 | 13 |
| 1 | 1 | 1 | 14 |

The two locations MR0 and MR1 hold bits setting a burst length for the memory device. The burst length is the length of data, or number of bytes, produced by the memory device in response to a read command from the memory hub controller. The two locations MR0 and MR1 hold bits setting the burst length as is shown in the truth table shown in Table V according to some embodiments of the invention. Columns MR0 and MR1 show the bits stored in the respective locations MR0 and MR1. The column Burst Length indicates the burst length determined by the bits in the locations MR0 and MR1. In this embodiment of the invention, the burst length may be either 8 bytes or 16 bytes.

TABLE V

| MR1 | MR0 | Burst Length |
|---|---|---|
| 0 | 0 | 8 |
| 0 | 1 | 16 |
| 1 | 0 | Reserved |
| 1 | 1 | Reserved |

In each of the mode registers 400, 500, and 600 shown in FIGS. 4-6 the bits on the address lines A0, A1, A2, and A10 are never inverted according to some embodiments of the invention.

Figure 7:
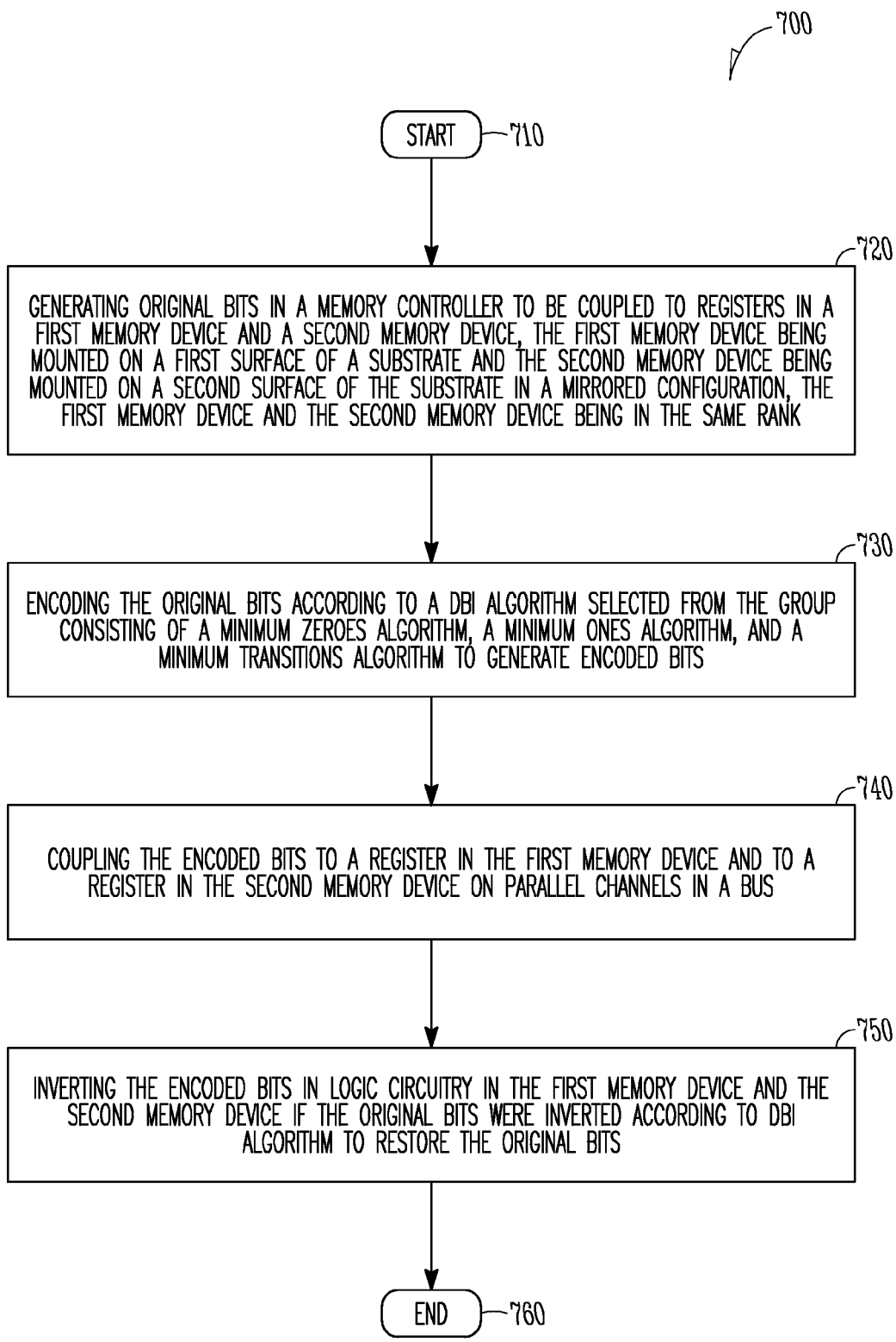
FIG. 7 is a flow diagram of several methods according to an embodiment of the invention.

FIG. 7 is a flow diagram of several methods 700 according to embodiments of the invention. The methods 700 start in block 710. In block 720, original bits are generated in a memory controller to be coupled to registers in a first memory device and a second memory device, the first memory device being mounted on a first surface of a substrate and the second memory device being mounted on a second surface of the substrate in a mirrored configuration, the first memory device and the second memory device being in the same rank. In block 730, the original bits are encoded according to a DBI algorithm selected from the group consisting of a minimum zeroes algorithm, a minimum ones algorithm, and a minimum transitions algorithm, or the original bits are inverted by a 1:2 buffer circuit to generate encoded bits. In block 740, the encoded bits are coupled to a register in the first memory device and to a register in the second memory device on parallel channels in a bus. In block 750, the encoded bits are inverted in logic circuitry in the first memory device and the second memory device if the original bits were inverted according to the DBI algorithm to restore the original bits. In block 760, the methods 700 end.

Figure 8:
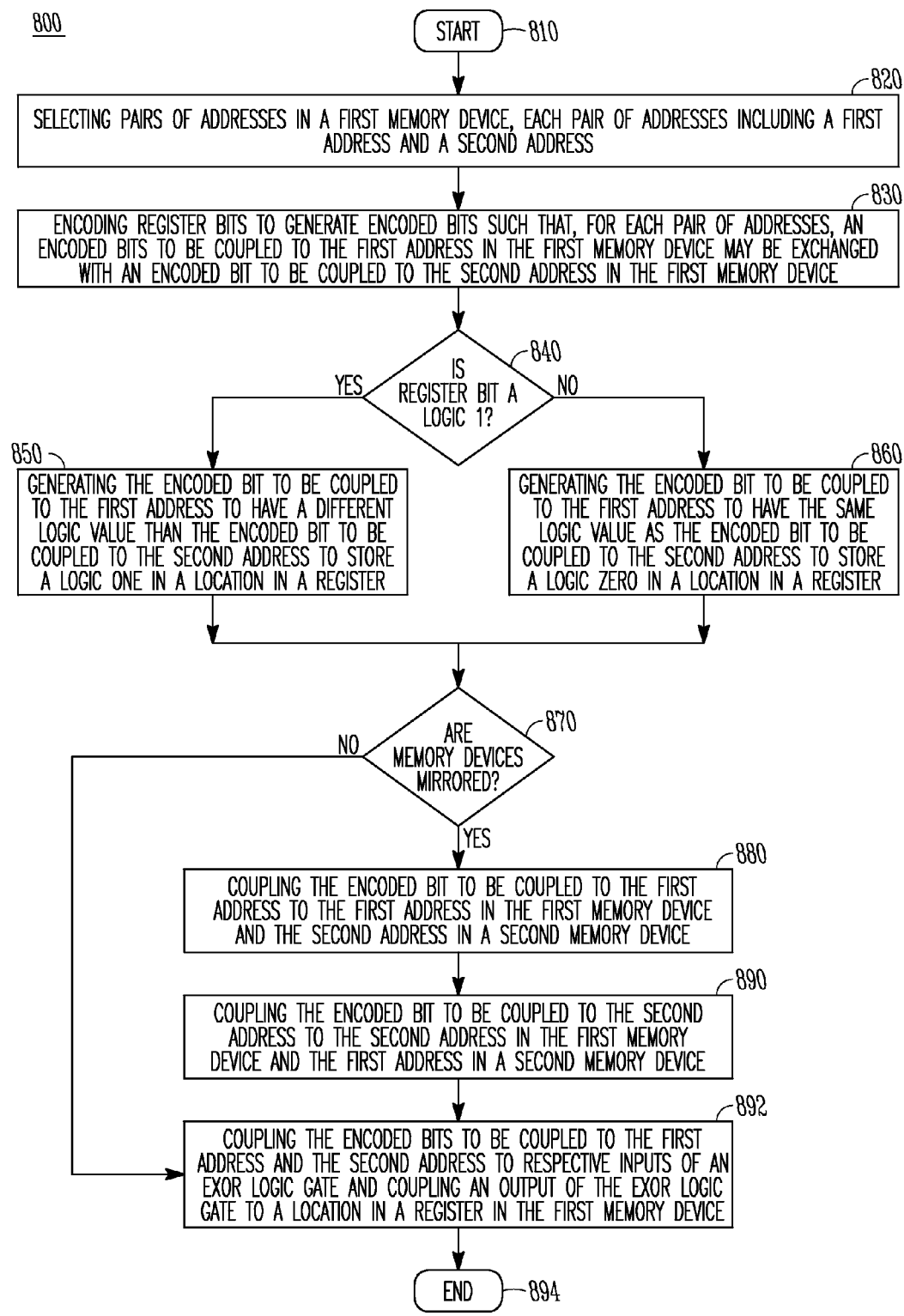
FIG. 8 is a flow diagram of several methods according to an embodiment of the invention.

FIG. 8 is a flow diagram of several methods 800 according to embodiments of the invention. The methods 800 start in block 810. In block 820, pairs of addresses in a first memory device are selected, each pair of addresses including a first address and a second address. In block 830, register bits are encoded to generate encoded bits such that, for each pair of addresses, an encoded bit to be coupled to the first address in the first memory device may be exchanged with an encoded bit to be coupled to the second address in the first memory device. In block 840, the methods 800 may include determining, for each register bit, if the register bit is a logic one. If the register bit is a logic one, the methods 800 generate the encoded bit to be coupled to the first address to have a different logic value than the encoded bit to be coupled to the second address to store a logic one in a location in a register in block 850. If the register bit is not a logic one, the methods 800 may include generating the encoded bit to be coupled to the first address to have the same logic value as the encoded bit to be coupled to the second address to store a logic zero in a location in a register in block 860. In block 870, the methods 800 may include determining if two memory devices are mounted in a mirrored configuration. If the memory devices are mounted in a mirrored configuration, the methods 800 may include coupling the encoded bit to be coupled to the first address to the first address in the first memory device and the second address in a second memory device in block 880 and the methods 800 may include coupling the encoded bit to be coupled to the second address to the second address in the first memory device and the first address in the second memory device in block 890. The methods 800 may then proceed to block 892 following block 890, or if the memory devices are not mounted in a mirrored configuration. In block 892, the encoded bits to be coupled to the first address and the second address are coupled to respective inputs of an EXOR logic gate and an output of the EXOR logic gate is coupled to a location in a register in the first memory device. In block 894, the methods 800 end.

Figure 9:
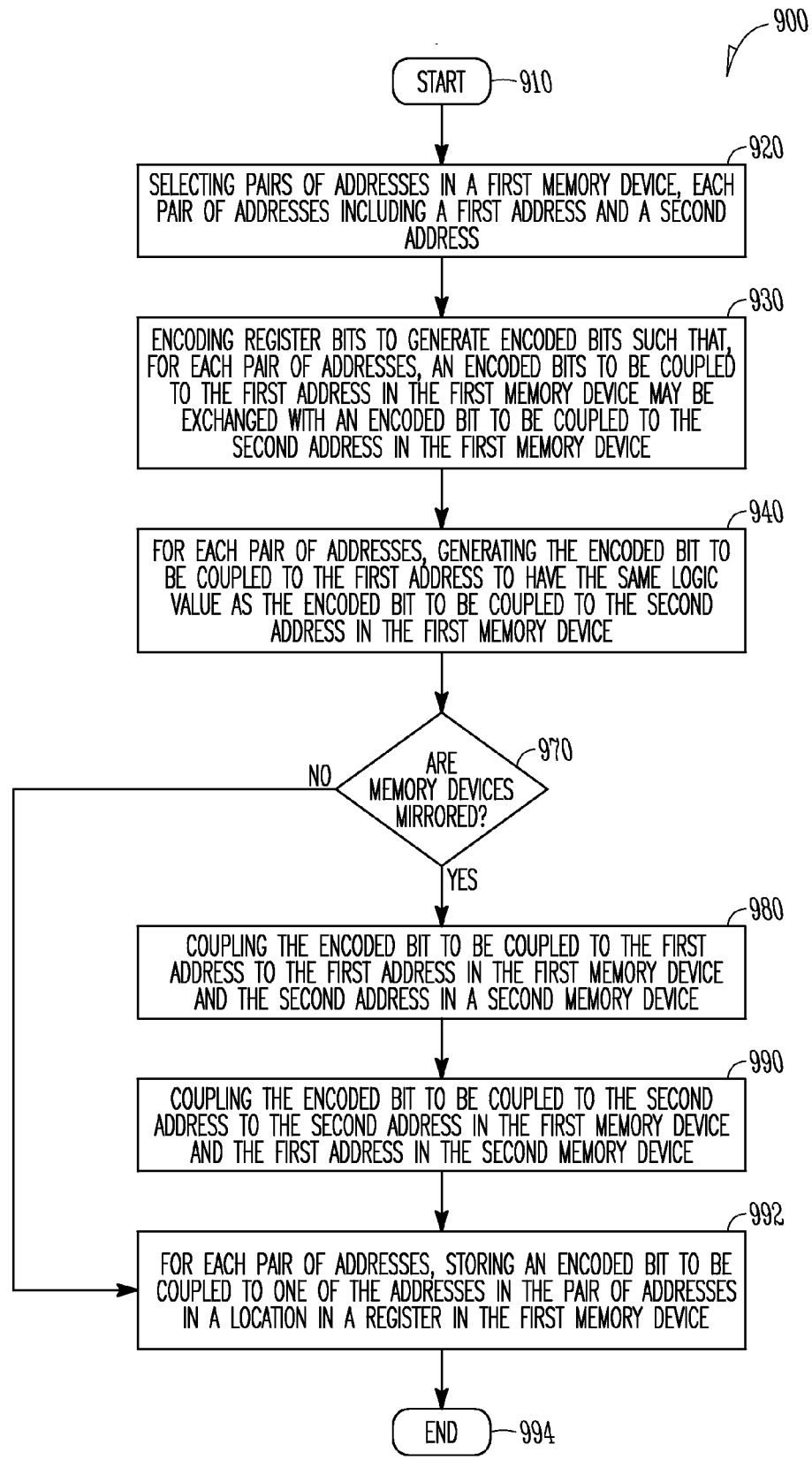
FIG. 9 is a flow diagram of several methods according to an embodiment of the invention.

FIG. 9 is a flow diagram of several methods 900 according to embodiments of the invention. The methods 900 start in block 910. In block 920, pairs of addresses in a first memory device are selected, each pair of addresses including a first address and a second address. In block 930, register bits are encoded to generate encoded bits such that, for each pair of addresses, an encoded bit to be coupled to the first address in the first memory device may be exchanged with an encoded bit to be coupled to the second address in the first memory device. In block 940, for each pair of addresses, the encoded bit to be coupled to the first address is generated to have the same logic value as the encoded bit to be coupled to the second address in the first memory device. In block 970, the methods 900 may include determining if two memory devices are mounted in a mirrored configuration. If the memory devices are mounted in a mirrored configuration, the methods 900 may include coupling the encoded bit to be coupled to the first address to the first address in the first memory device and the second address in a second memory device in block 980 and the methods 900 may include coupling the encoded bit to be coupled to the second address to the second address in the first memory device and the first address in the second memory device in block 990. The methods 900 may proceed to block 992 following block 990 or if the memory devices are not mounted in a mirrored configuration. In block 992, for each pair of addresses, an encoded bit to be coupled to one of the addresses in the pair of addresses is stored in a location in a register in the first memory device. In block 994, the methods 900 end.

Embodiments of the invention shown and described herein include EXOR logic gates. Other embodiments of the invention have other logic gates or combinations of logic gates in place of the EXOR logic gates to perform the same function.

Embodiments of the invention shown and described herein each include a SDRAM or a DRAM having a mode register that is written to or programmed from an address bus. Other embodiments of the invention may include volatile memory devices with registers written to or programmed from any bus that may be mounted in a mirrored configuration or receive bits that have been inverted.

The individual activities of methods 700, 800, and 900 may not have to be performed in the order shown or in any particular order. Some activities may be repeated, and others may occur only once. Embodiments of the invention may have more or less activities than those shown in FIGS. 7, 8, and 9.

Any of the circuits or systems described herein may be referred to as a module. A module may comprise a circuit and/or firmware according to embodiments of the invention.

The above description and the drawings illustrate some embodiments of the invention to enable those skilled in the art to practice the embodiments of the invention. Other embodiments may incorporate structural, logical, electrical, process, and other changes. In the drawings, like features or like numerals describe substantially similar features throughout the several views. Examples merely typify possible variations. Portions and features of some embodiments may be included in, or substituted for, those of others. Many other embodiments will be apparent to those skilled in the art upon reading and understanding the above description. Therefore, the scope of an embodiment of the invention is determined by the appended claims, along with the full range of equivalents to which such claims are entitled.

The Abstract is provided to comply with 37 C.F.R. §1.72(b) requiring an abstract that will allow the reader to quickly ascertain the nature of the technical disclosure. The Abstract is submitted with the understanding that it will not be used to interpret or limit the scope or meaning of the claims.

What is claimed is:

1. A method, comprising:
   receiving a first encoded bit at a first terminal of a first memory device and a second terminal of a second memory device;
   receiving a second encoded bit at a first terminal of the second memory device and a second terminal of the first memory device; and
   generating a restored bit from the first encoded bit and the second encoded bit in the first memory device.

2. The method of claim 1, further comprising generating the first encoded bit and the second encoded bit from an original bit.

3. The method of claim 2, further comprising:
   generating the first encoded bit to have a different logic value than the second encoded bit when the original bit is a logic one; and
   generating the first encoded bit to have the same logic value as the second encoded bit when the original bit is a logic zero.

4. The method of claim 2, wherein generating the restored bit comprises:
   receiving the first encoded bit at a first input of an exclusive-OR (EXOR) logic gate; receiving the second encoded bit at a second input of the EXOR logic gate; and
   generating the restored bit on an output of the EXOR logic gate, the restored bit having the same value as the original bit.

5. The method of claim 2, further comprising generating a second restored bit from the first encoded bit and the second encoded bit in the second memory device, the restored bit generated in the first memory device comprising a first restored bit.

6. The method of claim 5, wherein generating the second restored bit comprises:
   receiving the first encoded bit at a first input of an EXOR logic gate;
   receiving the second encoded bit at a second input of the EXOR logic gate; and
   generating the second restored bit on an output of the EXOR logic gate, the second restored bit having the same value as the original bit.

7. An apparatus comprising:
   a first memory device mounted on a first surface of a substrate, the first memory device comprising a first terminal and a second terminal; and
   a second memory device mounted on a second surface of the substrate different from the first surface, the second memory device comprising
      a third terminal coupled to the second terminal of the first memory device to receive a first encoded bit;
      a fourth terminal coupled to the first terminal of the first memory device to receive a second encoded bit; and
      an EXOR logic gate comprising
         a first terminal coupled to receive the first encoded bit;
         a second terminal coupled to receive the second encoded bit; and
         an output to generate a register bit from the first encoded bit and the second encoded bit.

8. The apparatus of claim 7, further comprising a register in the second memory device coupled to the output of the EXOR logic gate to receive the register bit.

9. The apparatus of claim 8, wherein the register in the second memory device comprises a mode register.

10. The apparatus of claim 7, wherein the first memory device and the second memory device comprise identical dynamic random access memory (DRAM) devices.

11. The apparatus of claim 7, wherein the first memory device further comprises:
    an EXOR logic gate comprising
       a first terminal coupled to receive the first encoded bit;
       a second terminal coupled to receive the second encoded bit; and
       an output to generate a register bit from the first encoded bit and the second encoded bit; and
    a mode register coupled to the output of the EXOR logic gate to receive the register bit.

12. The apparatus of claim 7, further comprising a memory hub controller coupled to the first memory device and the second memory device.

13. A method, comprising:
    generating a first encoded bit and a second encoded bit to have different logic values when an original bit is a logic one;
    generating the first encoded bit and the second encoded bit to have the same logic value when the original bit is a logic zero;
    receiving the first encoded bit at a first terminal of a first memory device and a second terminal of a second memory device;
    receiving the second encoded bit at a first terminal of the second memory device and a second terminal of the first memory device; and
    generating a restored bit from the first encoded bit and the second encoded bit in the first memory device.

14. The method of claim 13, wherein generating the restored bit comprises:
    receiving the first encoded bit at a first input of an exclusive-OR (EXOR) logic gate; receiving the second encoded bit at a second input of the EXOR logic gate; and
    generating the restored bit on an output of the EXOR logic gate, the restored bit having the same value as the original bit.

15. The method of claim 13, further comprising generating a second restored bit from the first encoded bit and the second encoded bit in the second memory device, the restored bit generated in the first memory device comprising a first restored bit.

16. The method of claim 15, wherein generating the second restored bit comprises:
    receiving the first encoded bit at a first input of an exclusive-OR (EXOR) logic gate; receiving the second encoded bit at a second input of the EXOR logic gate; and
    generating the second restored bit on an output of the EXOR logic gate, the second restored bit having the same value as the original bit.

17. The method of claim 13, further comprising storing the restored bit in a mode register.

18. A method, comprising:
    receiving a first encoded bit at a first terminal of a first memory device and a second terminal of a second memory device and receiving a second encoded bit at a first terminal of the second memory device and a second terminal of the first memory device at substantially the same time; and generating a first restored bit from the first encoded bit and the second encoded bit in the first memory device and generating a second restored bit from the first encoded bit and the second encoded bit in the second memory device at substantially the same time.

19. The method of claim 18, further comprising
generating the first encoded bit and the second encoded bit having different logic values when an original bit is a logic one; and
generating the first encoded bit and the second encoded bit having the same logic value when the original bit is a logic zero.

20. The method of claim 18, wherein:
generating the first restored bit comprises
receiving the first encoded bit at a first input of a first exclusive-OR (EXOR) logic gate in the first memory device;
receiving the second encoded bit at a second input of the first EXOR logic gate; and
generating the first restored bit on an output of the first EXOR logic gate, the first restored bit having the same value as the original bit; and
generating the second restored bit comprises
coupling the first encoded bit to a first input of a second EXOR logic gate in the second memory device;
coupling the second encoded bit to a second input of the second EXOR logic gate; and
generating the second restored bit on an output of the second EXOR logic gate, the second restored bit having the same value as the original bit.

21. The method of claim 18, further comprising:
receiving a third encoded bit at a third terminal of the first memory device and a fourth terminal of the second memory device and receiving a fourth encoded bit at a third terminal of the second memory device and a fourth terminal of the first memory device at substantially the same time; and
generating a third restored bit from the third encoded bit and the fourth encoded bit in the first memory device and generating a fourth restored bit from the third encoded bit and the fourth encoded bit in the second memory device at substantially the same time.

22. An apparatus, comprising:
a first memory device including a plurality of terminals mounted on a first surface of a substrate;
a second memory device including a plurality of terminals mounted on a second surface of the substrate, each terminal of the first memory device being coupled to a respective terminal of the second memory device and to a channel to receive a signal, the terminals coupled to each channel representing different addresses in the first memory device and the second memory device; and
a plurality of logic circuits in the first memory device, each logic circuit being coupled to a pair of the terminals of the first memory device to combine signals received by the pair of terminals of the first memory device into a combined signal.

23. The apparatus of claim 22, wherein at least some of the plurality of logic circuits comprise an exclusive-OR (EXOR) logic gate.

24. The apparatus of claim 22, further comprising:
a plurality of EXOR logic gates in the second memory device, each EXOR logic gate being coupled to a pair of the terminals of the second memory device to combine signals received by the pair of terminals of the second memory device into a combined signal; and
a register in the second memory device coupled to the EXOR logic gates in the second memory device to store bits representing the combined signal of the second memory device.

25. The apparatus of claim 22, further comprising a register in the first memory device coupled to the logic circuits to store bits representing the combined signal of the first memory device.

26. The apparatus of claim 22, wherein each signal received by one of the terminals represents one or more bits.

27. The apparatus of claim 22, wherein:
each channel comprises a conductive line or trace coupled to a memory controller;
each terminal comprises a bonding pad; and
the first memory device and the second memory device each comprise an array of memory cells.

* * * * *